(12) United States Patent
Hirota

(10) Patent No.: US 9,419,200 B2
(45) Date of Patent: Aug. 16, 2016

(54) PIEZOELECTRIC ACTUATOR AND RECORDING HEAD

(71) Applicant: Brother Kogyo Kabushiki Kaisha, Nagoya-shi, Aichi-ken (JP)

(72) Inventor: Atsushi Hirota, Nagoya (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 14/663,536

(22) Filed: Mar. 20, 2015

(65) Prior Publication Data

US 2015/0273830 A1   Oct. 1, 2015

(30) Foreign Application Priority Data

Mar. 31, 2014   (JP) .................................. 2014-072695

(51) Int. Cl.
| | | |
|---|---|---|
| *B41J 2/14* | (2006.01) | |
| *H01L 41/08* | (2006.01) | |
| *H01L 41/09* | (2006.01) | |
| *H01L 41/318* | (2013.01) | |

(52) U.S. Cl.
CPC ......... *H01L 41/0805* (2013.01); *B41J 2/14233* (2013.01); *H01L 41/081* (2013.01); *H01L 41/0973* (2013.01); *B41J 2202/11* (2013.01); *H01L 41/318* (2013.01)

(58) Field of Classification Search
CPC . B41J 2/14201; B41J 2/14233; B41J 2/14274
See application file for complete search history.

(56) References Cited

U.S. PATENT DOCUMENTS

| | | | |
|---|---|---|---|
| 6,350,019 B1 | 2/2002 | Shingai et al. | |
| 7,101,026 B2 * | 9/2006 | Shimada | ............. B41J 2/14233 347/68 |
| 2004/0046838 A1 | 3/2004 | Junhua | |

(Continued)

FOREIGN PATENT DOCUMENTS

| | | |
|---|---|---|
| JP | 2001-026106 | 1/2001 |
| JP | 2013-063559 | 4/2013 |

(Continued)

OTHER PUBLICATIONS

Extended European Search Report for EP application No. 15 160 352.9 dated Sep. 22, 2015.

*Primary Examiner* — Geoffrey Mruk
(74) *Attorney, Agent, or Firm* — Frommer Lawrence & Haug LLP

(57) ABSTRACT

There is provided a piezoelectric actuator configured to displace to project toward a pressure chamber to apply pressure to a liquid inside the pressure chamber, the piezoelectric actuator including: a vibration plate having a compressive stress; a piezoelectric layer having a pulling stress; and an individual electrode. The compressive stress of the vibration plate has a magnitude which is not less than a threshold value at which an extreme point is generated in a relationship between a compliance of the piezoelectric actuator and a displacement volume of the pressure chamber in a case that an electric voltage is applied to the piezoelectric actuator, the displacement volume converting from increasing to decreasing relative to increase in the compliance at the extreme point; and the thickness of the piezoelectric actuator is not less than a first thickness corresponding to a compliance allowing the extreme point to generate.

14 Claims, 6 Drawing Sheets

(56) References Cited

U.S. PATENT DOCUMENTS

2008/0012054 A1 1/2008 Ifuku et al.
2013/0070021 A1 3/2013 Nishimura et al.

FOREIGN PATENT DOCUMENTS

| WO | WO 2012/018561 | 2/2012 |
| WO | WO 2012/096646 | 7/2012 |

* cited by examiner

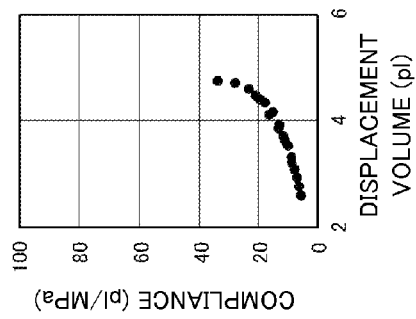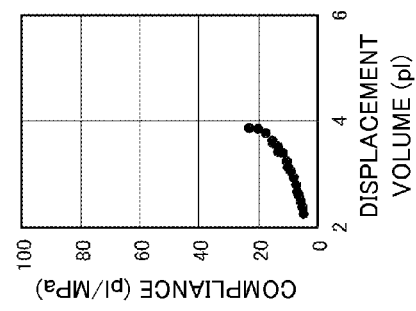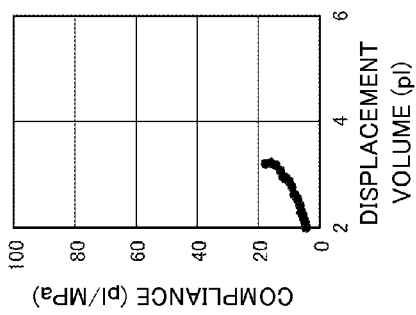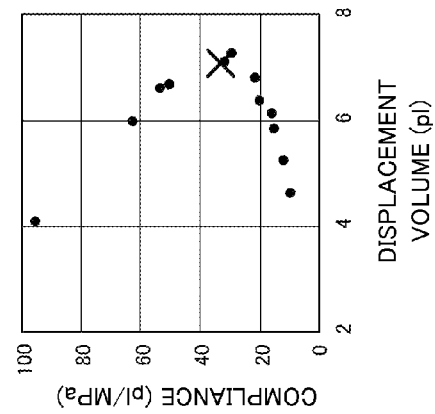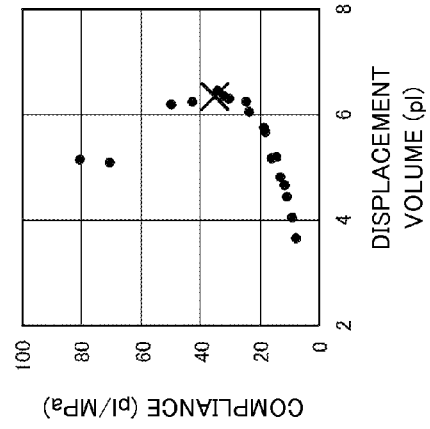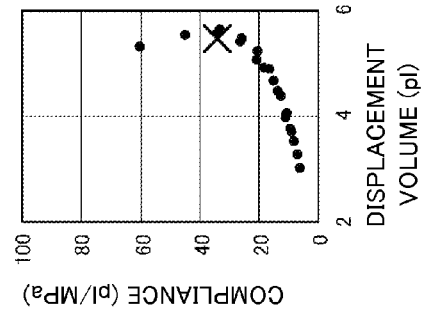

PIEZOELECTRIC ACTUATOR AND RECORDING HEAD

CROSS REFERENCE TO RELATED APPLICATION

The present application claims priority from Japanese Patent Application No. 2014-072695 filed on Mar. 31, 2014, the disclosure of which is incorporated herein by reference in its entirety.

BACKGROUND

1. Field of the Invention

The present teaching relates to a piezoelectric actuator capable of applying pressure to a liquid in a pressure chamber and a recording head provided with the piezoelectric actuator.

2. Description of the Related Art

A known recording head includes an individual channel substrate constructed of a plurality of individual liquid chambers (pressure chambers) formed therein, a vibration plate covering the respective liquid chambers, an electromechanical transducing element which is formed on the vibration plate and which is constructed of a lower electrode, a piezoelectric member (piezoelectric layer) and an upper electrode. The electromechanical transducing element of the recording head is formed by a film-forming method using the sol-gel method, and is driven when an electric signal is supplied to the electromechanical transducing element. By mechanical vibration of the vibration plate accompanying with the driving of the electromechanical transducing element, pressure is applied to the liquid such as an ink inside each of the individual liquid chambers, thereby causing the ink to be discharged from nozzles.

SUMMARY

In the known recording head, the piezoelectric member of the electromechanical transducing element is formed by the sol-gel method (including a sintering process), etc., and thus the pulling stress (tensile stress, stretching stress) remains in the piezoelectric member. Therefore, a strong pulling force is applied from the piezoelectric member to the vibration plate, which in turn lowers the deformation ability (deformability) of the vibration plate and of the electromechanical transducing element in a case that voltage is applied (an electric signal is supplied) to the upper and lower electrodes of the electromechanical transducing element. As a result, there arises such a problem that a displacement volume achieved by the vibration plate and the electromechanical transducing element (the volume present in each of the individual liquid chambers obtained by the displacement of the vibration plate) is lowered.

In view of the above situation, the inventor of the present teaching considered a configuration for mitigating the pulling stress of the piezoelectric layer (piezoelectric member) by allowing compressive stresses having a variety of kinds of magnitudes to remain in the vibration plate, the inventor found out a task to be solved as described later and arrived at the present teaching.

An object of the present teaching is to provide a piezoelectric actuator which is capable of securing a high deformability of the piezoelectric actuator as well as suppressing any breakage of the piezoelectric actuator.

According to a first aspect of the present teaching, there is provided a piezoelectric actuator which is fixed to one flat surface to cover a pressure chamber opening in the one flat surface and which is configured to displace to project toward the pressure chamber based on an electric voltage applied to the piezoelectric actuator so as to apply pressure to a liquid inside the pressure chamber, the piezoelectric actuator including:

a vibration plate fixed to the one flat surface and having a compressive stress;

a piezoelectric layer having a pulling stress and stacked on the vibration plate at a position which is on an opposite side to the one flat surface and at which the piezoelectric layer overlaps with the pressure chamber in a direction orthogonal to the one flat surface; and an individual electrode stacked on the piezoelectric layer, wherein the compressive stress of the vibration plate has a magnitude not less than a threshold value at which an extreme point is generated in a relationship between a compliance of the piezoelectric actuator and a displacement volume of the pressure chamber in a case that the voltage is applied to the piezoelectric actuator, the displacement volume converting from increasing to decreasing relative to increase in the compliance at the extreme point; and a thickness of the piezoelectric actuator is not less than a first thickness corresponding to a compliance allowing the extreme point to generate.

According to this configuration, the piezoelectric layer has the pulling stress which is mitigated by the compressive stress of the vibration plate, and the compliance of the piezoelectric actuator itself is not more than the threshold value (the thickness of the piezoelectric actuator itself is not less than the threshold value). Therefore, the deformability of the piezoelectric actuator is improved corresponding to the compressive stress of the vibration plate. Further, since the piezoelectric actuator has the remaining compressive stress which does not become disproportionally excessive relative to (considering) the rigidity of the piezoelectric actuator itself, and thus is capable of avoiding the buckling-like deformation. Therefore, it is possible to suppress any breakage of the piezoelectric actuator while securing a high deformability of the piezoelectric actuator.

According to the piezoelectric actuator of the present teaching, since the piezoelectric layers have the pulling stress, and the pulling stress of the piezoelectric layers is mitigated by the compressive stress of the vibration plate, and the compliance of the piezoelectric actuator itself is not more than the threshold value (the thickness of the piezoelectric actuator itself is not less than the threshold value). Therefore, the deformability of the piezoelectric actuator is improved corresponding to the compressive stress of the vibration plate. Further, since the piezoelectric actuator has the remaining compressive stress which does not become disproportionally excessive relative to the rigidity of the piezoelectric actuator itself, and thus is capable of avoiding any excessive deformation. Thus, it is possible to suppress any breakage of the piezoelectric actuator while securing a high deformability of the piezoelectric actuator.

BRIEF DESCRIPTION OF THE DRAWINGS

FIG. 1A depicts a cross-sectional view of main components or parts of the piezoelectric actuator, and FIG. 1B is a plane view of the main components or parts of the piezoelectric actuator.

FIGS. 4A to 4F are each a graph indicating the relationship between the compliance and the displacement volume under a first condition.

DESCRIPTION OF THE EMBODIMENTS

Figure 1A:
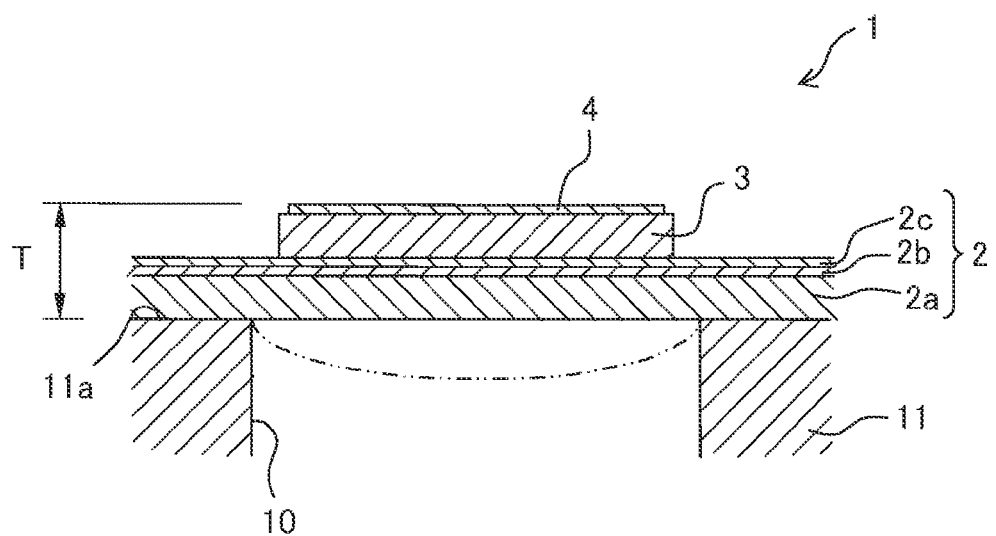
FIGS. 1A and 1B each depict a piezoelectric actuator in an embodiment wherein the present teaching is applied to a recording head.
Figure 1B:
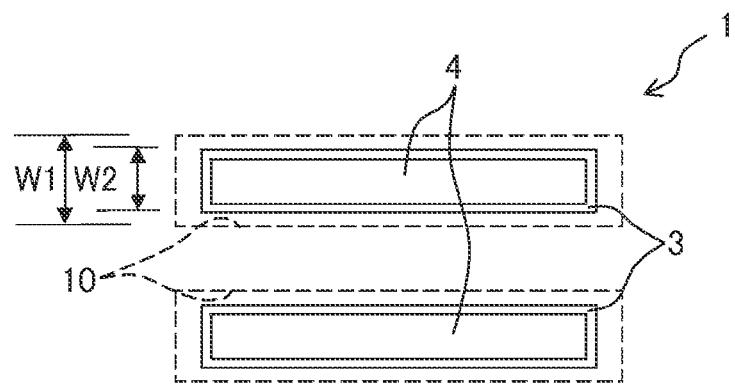

At first, a piezoelectric actuator 1 adopted when considering the above-described configuration will be explained with reference to a recording head of FIG. 1. As depicted in FIG. 1, the piezoelectric actuator 1 is fixed to an upper surface 11a (one flat surface) of a supporting substrate 11 and covers the openings of pressure chambers 10 formed in the supporting substrate 11. In the piezoelectric actuator 1, in a case that a predetermined voltage is applied to an individual electrode 4 and a common electrode 2c (both of which are to be described later on), each of portions of the piezoelectric actuator 1, corresponding to one of the pressure chamber 10, is displaced (deformed) to protrude toward the corresponding pressure chamber 10 (as depicted in a two-dot chain line in FIG. 1A) so as to apply pressure to a liquid in the corresponding pressure chamber 10. Each of the pressure chambers 10 is communicated with a nozzle (not depicted). In a case that the pressure is applied to the liquid inside the pressure chamber 10, the liquid is discharged from the nozzle. In this situation, the liquid is supplied from a liquid supply section (not depicted) to the inside of the pressure chamber 10. As depicted in FIG. 1B, A plurality of pieces of the pressure chamber 10 each having a rectangular shape in a plane view which is elongated in the left and right direction are arranged to be aligned in one direction (up and down direction in FIG. 1A).

The piezoelectric actuator 1 has a vibration plate 2, a plurality of piezoelectric layers 3 and a plurality of individual electrodes 4. The vibration plate 2 is formed to straddle (cover) the plurality of pressure chambers 10, and has a vibration-plate body 2a, a protective layer 2b and a common electrode 2c. The vibration plate-body 2a has a two-layered structure constructed of a silicon oxide film ($SiO_2$ film) and a silicon nitride film (SiN film), and the lower surface of the silicon oxide film is a fixation surface fixable to the supporting substrate 11. The protective layer 2b is composed of aluminum oxide ($AL_2O_3$), and formed on the entire upper surface of the vibration plate-body 2a. The protective layer 2b is a diffusion preventing layer, and configured to restrict, via the protective layer 2b, any movement of oxygen, hydrogen and any other element(s) constructing other layer(s). The common electrode 2c has a two-layered structure constructed of titanium (Ti) and platinum (Pt), and is formed on the entire upper surface of the protective layer 2b. Note that the vibration plate-body 2a is formed on the upper surface 11a of the supporting substrate 11 with a publicly known plasma CVD method before the pressure chambers 10 are formed in the supporting substrate 11. Further, the protective layer 2b and the common electrode 2c are successively formed in the vibration plate-body 2a with a publicly known sputtering method.

Each of the piezoelectric layers 3 is stacked on the upper surface of the vibration plate 2 (the upper surface of the common electrode 2c) such that each of the piezoelectric layers 3 is arranged at a facing area facing or opposite to one of the pressure chambers 10 in the vertical direction (direction orthogonal to the upper surface 11a), the facing area being an area depicted in a broken line in FIG. 1B. Each of the piezoelectric layers 3 is composed of lead zirconate titanate (PZT), and formed with a sol-gel method. Each of the individual electrodes 4 is composed of platinum (Pt) and is stacked on the upper surface of one of the piezoelectric layers 3. The individual electrodes 4 are formed with a publicly known sputtering method.

Figure 2A:
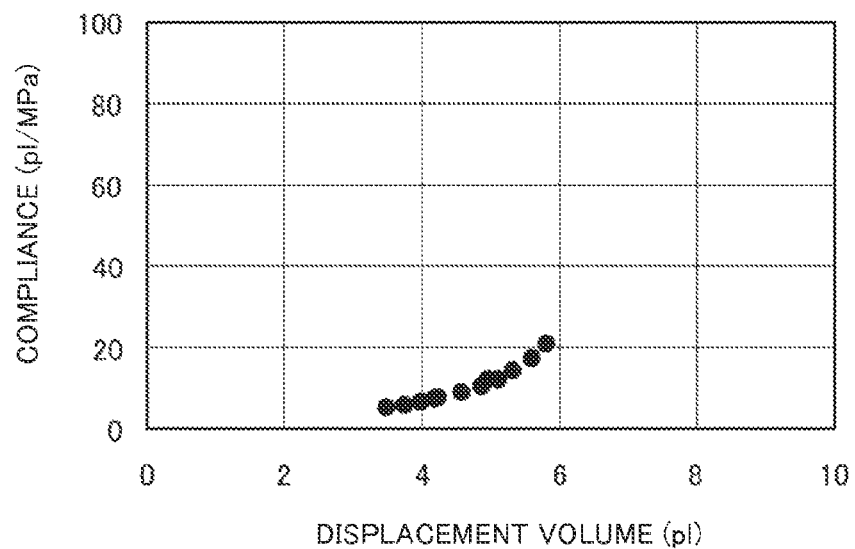
FIG. 2A is a graph indicating a relationship between the compliance and the displacement volume of the piezoelectric actuator in a case that the remaining pulling stress of a piezoelectric layer is 200 MPa and the remaining compressive stress of a vibration plate is 200 MPa.
Figure 2B:
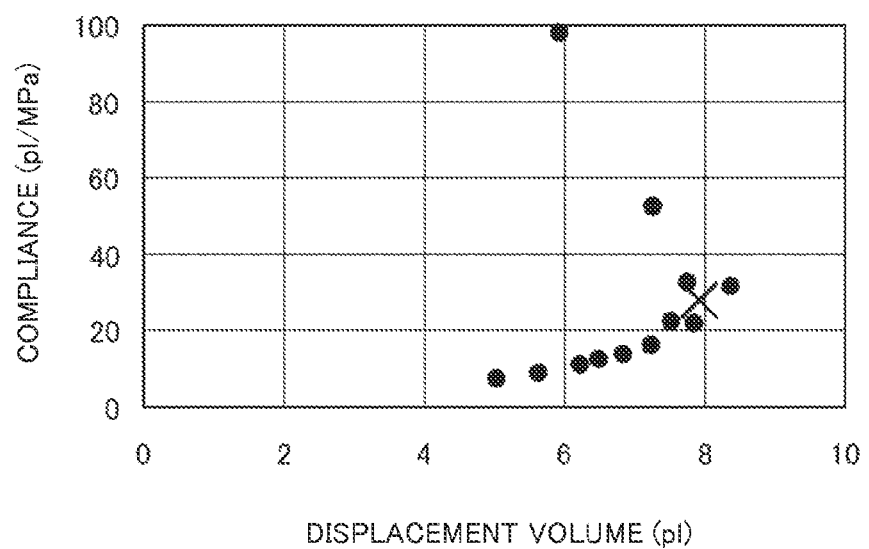
FIG. 2B is a graph indicating a relationship between the compliance and the displacement volume of the piezoelectric actuator in a case that the remaining pulling stress of the piezoelectric layer is 200 MPa and the remaining compressive stress of the vibration plate is 500 MPa.

Here, the compressive stress allowed to remain in the vibration plate 2 was varied, for example, in a range of 100 Mpa to 500 Mpa and a thickness T of the piezoelectric actuator 1 was varied at a regular amount for each of the varied compressive stresses; and an investigation was carried out regarding the relationship between a displacement volume (pl) and the compliance in relation to the combination of these conditions which were the varied compressive stress and the varied thicknesses T. In this case, the thickness of the vibration plate-body 2a was varied in a range of 0.4 μm to 2.0 μm, and the thickness of the piezoelectric layer 3 was varied in a range of 0.4 μm to 1.0 μm. The thickness T of the piezoelectric actuator 1 was varied in a range of 1.05 μm to 3.25 μm at a 0.2 μm-segment. Note that the constitutive parts of the piezoelectric actuator 1, which are different from the vibration plate-body 2a and the piezoelectric layers 3, were formed by a common film-forming condition so as to have the entire and constant thickness of 0.25 μm. Further, a width W1 of the pressure chamber 10 (the width in the up and down direction in FIG. 1B) was made to be 70 μm, a width W2 of the piezoelectric layer 3 (the width in the up and down direction in FIG. 1B) was made to be 50 μm; and the pulling stress of the piezoelectric layer 3 was made to be 200 Mpa, and the voltage applied to the individual electrode 4 and the common electrode 2c was made to have a predetermined, fixed value. Note that the compliance was obtained by the following manner. Namely, the piezoelectric actuator 1 was grasped as a two-dimensional model which is fixed at the both end portions thereof, and the compliance was calculated from displacement amounts of the piezoelectric actuator 1 in relation to the combinations of the sizes of the respective layers, the internal stress, etc., in a case that a predetermined load was applied to the piezoelectric actuator 1. The results of measurement are indicated in FIGS. 2A and 2B. FIG. 2A indicates a case that the remaining compressive stress was 200 MPa, and the FIG. 2B indicates a case that the remaining compressive stress was 500 MPa. FIGS. 2A and 2B include data of the piezoelectric actuators which have a similar configuration with the same thicknesses (the same thickness of the vibration plate-body 2a and the same thickness of the piezoelectric layers 3), except that the piezoelectric actuators were mutually different in the compressive stress thereof.

In each of the graphs of FIGS. 2A and 2B, as the displacement volume as the horizontal axis is greater, it is more preferable, contributing to the driving at a lower voltage and to the size reduction of the pressure chamber 10. As the thickness of the piezoelectric actuator 1 is greater, the compliance as the vertical axis becomes smaller, thereby making it possible to obtain a piezoelectric actuator 1 having a high hardness, contributing to the driving at a high frequency and to the effective conversion of the piezoelectric deforming force (driving force) to the discharge energy. In a case that the remaining compressive stresses is low (such as 200 Mpa) as indicated in FIG. 2A, the displacement volume becomes greater, as the compliance (Cp) becomes greater within the variation range of the thickness of the piezoelectric actuator 1. In a case that the remaining compressive stresses is high (such as 500 Mpa) as indicated in FIG. 2B, the displacement volume exhibits a tendency similar to that in the case of the low remaining compressive stress (as in FIG. 2A), in an area in which the compliance is lower than approximately 30 pl/MPa (lower than the point in FIG. 2B indicated by a mark "X"). When comparing the cases indicated in FIG. 2A and FIG. 2B, respectively, under the condition that the compliance was same for the both cases, the displacement volume becomes greater as the remaining compressive stress is higher. With this, the energy transmittance efficiency is effectively improved.

However, in FIG. 2B, in another area in which the compliance is higher than approximately 30 pl/MPa (higher than the point indicated by the mark "X"), the displacement volume becomes smaller as the compliance becomes greater. Namely, in the case that the remaining compressive stress is high, an extreme point (the mark "X" in FIG. 2B) appears (is generated) in the compliance-displacement volume characteristic. Note that the extreme point of FIG. 2B is derived based on plurality of measurement points and from an approximate curve based on the distribution of the plurality of measurement points.

The piezoelectric actuator 1 is restrained by partition wall portions (the supporting substrate 11) defining the pressure chamber 10. The actual piezoelectric actuator 1 has the remaining compressive stress in each of the layers, and is already deformed even in an initial state with no voltage is being applied (initial displacement). In the example, the piezoelectric actuator 1 is (initially) deformed (displaced) to project toward the pressure chamber 10. When the piezoelectric actuator 1 is driven in this state, two deformation effects as follows act on the piezoelectric actuator 1.

One of the two effects is the unimorph deformation of the piezoelectric actuator 1. The unimorph deformation is a deformation based on the combination of the piezoelectric layer 3 and the vibration plate 2 in which the piezoelectric layer 3 voluntary shrinks to thereby generate a distortion difference in the plane direction between the piezoelectric layer 3 and the vibration plate 2, which in turn causes the piezoelectric actuator 1 to deform to project toward the pressure chamber 10. In this example, the deformation is in a direction for decreasing the volume of the pressure chamber 10 (direction for increasing the displacement volume). In this case, as the remaining compressive stress in the vibration plate 2 is greater, the compliance becomes higher, thereby facilitating the unimorph deformation (the deformation amount is greater). The other of the two effects is restoration of the piezoelectric actuator 1 to a flat state. In the deformation mainly based on the voluntary shrinkage of the piezoelectric layer 3, the piezoelectric actuator 1 is changed to the flat state. In the example, the restoration is in a direction for increasing the volume of the pressure chamber 10 (in a direction decreasing the displacement volume). In this case, as the initial displacement (the remaining compressive stress in the vibration plate 2) is greater, the piezoelectric actuator 1 restores to the flat state more greatly.

Here, the extreme point described above is a point at which the displacement volume becomes constant in relation to the change in the compliance, and can be considered as a point at which the contribution to the displacement volume by the unimorph deformation and the contribution to the displacement volume by the restoration are balanced. With the extreme point as the boundary, the effect of the unimorph deformation is dominant in the area at which the compliance is small, whereas the effect of the restoration is conspicuous in the area at which the compliance is great. Therefore, the increasing ratio, of the displacement volume (corresponding to the effective displacement as the difference between the deformation by the driving and the initial deformation), in relation to the compliance is changed from positive to negative, with the extreme point as the boundary.

Figure 3A:
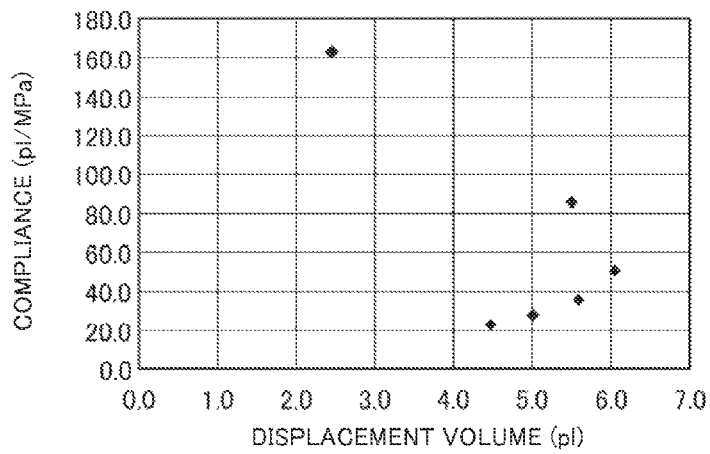
FIG. 3A is a graph indicating the compliance-displacement volume characteristic in a case that the thickness of the piezoelectric layer is 0.4 μm, the remaining pulling stress of the piezoelectric layer is 200 MPa, and the thickness of the vibration plate is 0.8 μm.
Figure 3B:
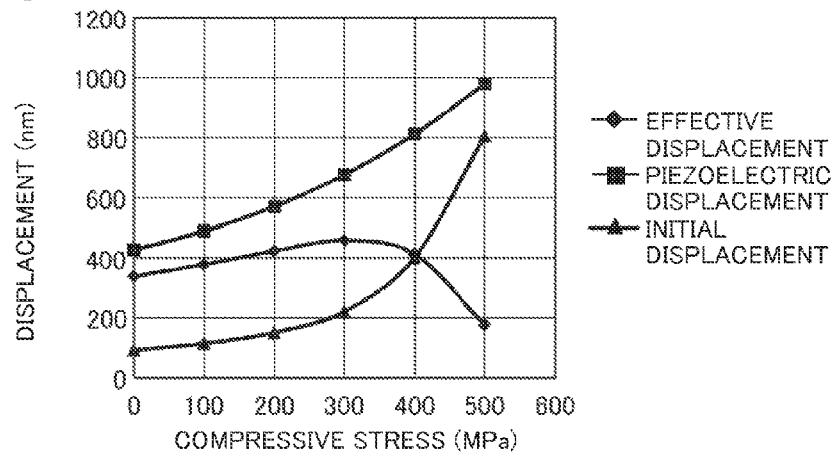
FIG. 3B is a graph indicating the displacement-remaining compressive stress characteristic in the case that the thickness of the piezoelectric layer is 0.4 μm, the remaining pulling stress of the piezoelectric layer is 200 MPa, and the thickness of the vibration plate is 0.8 μm.
Figure 3C:
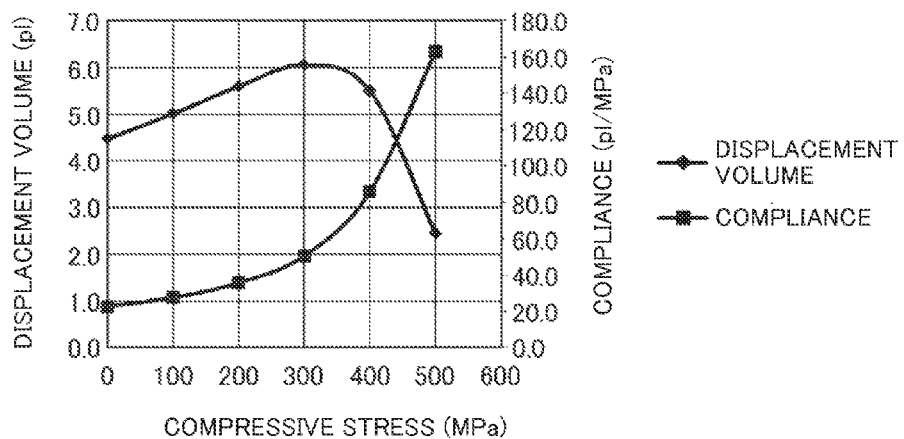
FIG. 3C is a graph indicating the displacement volume and the compliance-remaining compressive stress characteristic in the case that the thickness of the piezoelectric layer is 0.4 μm, the remaining pulling stress of the piezoelectric layer is 200 MPa, and the thickness of the vibration plate is 0.8 μm.

Specific explanation will be given with reference to FIGS. 3A to 3C. In a case that the thickness of the piezoelectric layer 3 is 0.4 µm, the remaining pulling stress is 200 MPa, and the thickness of the vibration plate 2 is 0.8 µm, FIG. 3A indicates the compliance-displacement volume characteristic and FIG. 3B indicates the displacement-remaining compressive stress characteristic. Note that the piezoelectric displacement includes the both effects of unimorph deformation and restoration. FIG. 3C indicates the displacement volume and the compliance-remaining compressive stress characteristic. The compliance-displacement volume characteristic uses the remaining compressive stress of the vibration plate 2 as the parameter, wherein data points in FIG. 3C indicate correspondence among the displacement volume, compliance and remaining compressive stress within a remaining compressive stress range of 0 Mpa to 500 Mpa, at a 100 Mpa-segment and in an ascending order of the values of the compliance.

The extreme point is a data point at which the remaining compressive stress is 300 Mpa. At this point, the effective displacement becomes maximal, as depicted in FIG. 3B. With the extreme point as the boundary, the initial displacement is rapidly increased and the effective displacement is decreased. As indicated in FIG. 3C, the compliance increased rapidly in relation to the remaining compressive stress, with the compliance of 300 MPa as the boundary. However, as indicated in FIG. 3B, although the initial displacement exhibits the change corresponding to the rapid increase in the compliance (as indicated in FIG. 3C), the piezoelectric displacement exhibits a slow increase. Based on this, it is possible to consider that a ratio of the contribution brought about by the restoration is increased relative to another ratio of the contribution brought about by the piezoelectric displacement. On the other hand, compressive stress which is disproportionally excessive relative to the rigidity of the piezoelectric actuator 1 is inherent in an area in which the compliance is great. In this situation, the piezoelectric actuator 1 can be considered as being in a state that the initial deformation is very large. In the present teaching, such a very large deformation as this initial deformation that is very large is referred to as a buckling-like deformation. Note that in the present teaching, the term "buckling-like deformation" does not mean a deformation having such an extent that any crack is generated in the piezoelectric actuator and destroys the piezoelectric actuator as a result, but means such a state that although the piezoelectric actuator 1 is not destroyed, the piezoelectric actuator 1 is in a highly deformed state. If the piezoelectric actuator 1 is used in such a state, any crack is easily generated in the piezoelectric actuator 1. As a result, there arises such a problem that the piezoelectric actuator 1 is easily broken or destroyed.

Next, an embodiment of the present teaching will be explained as follow, with reference to the drawings.

The configuration of a piezoelectric actuator in a recording head of this embodiment is similar to that of the piezoelectric actuator 1 described above and depicted in FIG. 1, and thus any detailed explanation therefor will be omitted. A piezoelectric actuator 1 of the embodiment allows the vibration plate 2 to have a compressive stress remaining therein and having a value not less than a threshold value (to be described later on), in relation to a piezoelectric layer 3 having the pulling stress remaining therein. Thickness "T" of the piezoelectric actuator 1 is made to be not less than a predetermined thickness depending on the compressive stress allowed to remain in the vibration plate 2. The term "predetermined thickness" described herein means a thickness by which the piezoelectric actuator 1 takes an extreme point (maximal) in the compliance-displacement volume characteristic.

In the following, an explanation will be given about the extreme point which is generated under a predetermined condition (first and second conditions), with reference to FIGS. 4A to 4F and FIGS. 5A to 5F. As described above, piezoelectric layers 3 of the piezoelectric actuator 1 are formed by a publicly known sol-gel method. In this situation, a sol-gel solution (sol-gel) of a piezoelectric material is spin-coated on the vibration plate 2 under a predetermined condition, and then is dried at a predetermined temperature. This operation is repeated for a several times. Afterwards, the piezoelectric layers 3 having a predetermined thickness are formed by performing sintering at a predetermined temperature. In this case, it is possible to form the thin film-shaped piezoelectric layers 3 with a relatively easy method and inexpensively, and allows the pulling stress to remain inside the piezoelectric layers 3. The piezoelectric layers 3 may be formed also by performing the drying and sintering every time the spin-coat is performed.

The first condition is as follows: a width W1 of each of the pressure chambers 10 is 100 μm, a width W2 of each of the piezoelectric layers 3 is 70 μm, a voltage applied to individual electrodes 4 and a common electrode 2c has a predetermined fixed value, and the remaining pulling stress of the piezoelectric layers 3 is 100 Mpa. Under the first condition, the compressive stress of the vibration plate 2 is varied at a 100 MPa-segment in a range from 0 MPa up to 500 MPa. The relationship between the compliance (pl/MPa) and the displacement volume (pl) under the first condition is indicated in FIGS. 4A to 4F. Note that the thickness of each of the individual electrodes 4, the common electrode 2c and the protective layer 2b is made to have a predetermined, fixed value. In the embodiment, the thickness of the individual electrode 4 is 0.05 μm, the thickness of the common electrode 2c is 0.12 μm, and the thickness of the protective layer 2b is 0.08 μm. A vibration plate-body 2a is formed by stacking a plasma CVD film on a thermal oxidation film (thickness: 0.1 μm) formed on the upper surface of a supporting substrate 11 made of silicon (Si). At this situation, the pressure in a vacuum chamber, the supplied electric power (making electric power), the gas flow rate, etc., are changed (varied) so as to adjust the thickness of the vibration plate-body 2 and the compressive stress allowed to remain in the vibration plate-body 2a. Although the vibration plate-body 2a in this embodiment has a two-layered structure constructed of a silicon oxide film (SiO$_2$ film) and a silicon nitride film (SiN film), the vibration plate-body 2a may be formed only of the silicon oxide film, or may be composed of other material different from the silicon oxide film and the silicon nitride film. Note that the vibration plate-body 2a may be formed with a method different from the plasma CVD method (for example, the vapor deposition method, the sputtering method, the thermal oxidation method, etc.). Further, the thermal oxidation film of the supporting substrate 11 serves also as a stop layer configured to stop the etching when forming the pressure chambers 10.

A plurality of points indicated in each of FIGS. 4A to 4F correspond to thickness T, of the piezoelectric actuator 1, which is varied at a 0.2 μm-segment in a variation range of 2.15 μm to 4.15 μm. In this case, the thickness of the piezoelectric layer 3 is in a thickness range of 0.5 μm to 1.3 μm, the thickness of the vibration plate-body 2a is in a thickness range of 1.4 μm to 2.6 μm, and the piezoelectric layers 3 having the respective thicknesses in the thickness range and the vibration plate-bodies 2a having the respective thicknesses in the thickness range are combined.

FIG. 4A indicates a graph in a case that the remaining compressive stress of the vibration plate 2 is 0 MPa, wherein the displacement volume and the compliance both tend to increase together, as the thickness T of the piezoelectric actuator 1 becomes smaller. In this case, the piezoelectric actuator 1 does not have any extreme point in the compliance-displacement volume characteristic. FIG. 4B indicates a graph in a case that the remaining compressive stress of the vibration plate 2 is 100 MPa. The case indicated in FIG. 4B also exhibits a similar tendency to that of the case indicated in FIG. 4A. FIG. 4C indicates a graph in a case that the remaining compressive stress of the vibration plate 2 is 200 MPa. The case indicated in FIG. 4C also exhibits a similar tendency to that of the cases indicated in FIGS. 4A and 4B.

FIG. 4D indicates a graph in a case that the remaining compressive stress of the vibration plate 2 is 300 MPa. In this case, an extreme point (indicated by a sign "X" in FIG. 4D) is derived from an approximate curve based on a plurality of points. The extreme point appears in a case that the thickness T of the piezoelectric actuator 1 is 2.5 μm, and the compliance is 34.3 pl/MPa and the displacement volume is 5.5 pl at the extreme point. In an area in which the compliance is smaller than the extreme point, the displacement volume and the compliance both tend to increase together, as the thickness T of the piezoelectric actuator 1 becomes smaller, in a similar manner as in the cases indicated in FIGS. 4A to 4C. In this piezoelectric actuator 1, the difference between the piezoelectric displacement and the initial displacement (corresponding to the displacement volume) takes the maximum value at the extreme point. At the extreme point and in the vicinity of the extreme point, the both effects obtained by the unimorph deformation and restoration in relation to the predetermined applied voltage are in a close competition, and displacement volume hardly increases at the extreme point and in the vicinity thereof. As the thickness T of the piezoelectric actuator 1 becomes smaller, the compliance is further increased, and the displacement volume is gradually decreased. With this, the threshold value for appearance (generation) of the extreme point in relation to the compressive stress of the vibration plate 2, with respect to the pulling stress: 100 MPa of the piezoelectric layer 3, falls within a range of 200 MPa to 300 MPa of the compressive stress.

FIG. 4E indicates a graph in a case that the remaining compressive stress of the vibration plate 2 is 400 MPa. In this case, an extreme point derived from the approximate curve appears at a point at which the thickness T of the piezoelectric actuator 1 is 2.9 μm; and the compliance is 35.1 pl/MPa and the displacement volume is 6.3 pl at the extreme point. The relationship between the compliance and the displacement volume with the extreme point intervened therebetween is similar to the case that the remaining compressive stress is 300 MPa.

FIG. 4F indicates a graph in a case that the remaining compressive stress of the vibration plate 2 is 500 MPa. In this case, an extreme point derived from the approximate curve appears at a point at which the thickness T of the piezoelectric actuator 1 is 3.3 µm; and the compliance is 33.0 pl/MPa and the displacement volume is 7.1 pl at the extreme point. The relationship between the compliance and the displacement volume with the extreme point intervened therebetween is similar to the cases that the remaining compressive stresses are 300 MPa and 400 MPa, respectively. Note that although the relationship between the thickness of the piezoelectric actuator 1 and the compliance varies depending on the combination of the remaining compressive stress of the vibration plate 2 and the remaining compressive stress of the piezoelectric layer 3, there is such a tendency that as the thickness of the piezoelectric actuator 1 becomes smaller, the compliance becomes greater.

Next, the second condition is as follows: the width W1 of the pressure chamber 10 is changed to 132 µm, the width W2 of the piezoelectric layer 3 is changed to 92 µm, and the range of the thickness T of the piezoelectric actuator 1 is changed from that in the first condition. The remaining values different from the above-described values are same with those in the first condition. The relationship between the compliance (pl/MPa) and the displacement volume (pl) under the second condition is indicated in FIGS. 5A to 5F.

A plurality of points indicated in each of FIGS. 5A to 5F correspond to thickness T, of the piezoelectric actuator 1, which is varied in a variation range of 2.55 µm to 6.25 µm. More specifically, the thickness T of the piezoelectric actuator 1 is varied to have thicknesses of 2.55 µm, 2.65 µm, 2.95 µm, 3.05 µm, 3.15 µm, 5.25 µm, 5.35 µm, 5.45 µm, 5.75 µm, 5.85 µm and 6.25 µm, wherein in a range of 3.35 µm to 5.05 µm, the thickness T is varied at a 0.1 µm-segment. In this case, the thickness of the piezoelectric layer 3 is in a thickness range of 0.4 µm to 2.0 µm, the thickness of the vibration plate-body 2a in a thickness range of 1.5 µm to 4.0 µm, and the piezoelectric layers 3 having the respective thicknesses in the thickness range and the vibration plate-bodies 2a having the respective thicknesses in the thickness range are combined.

Figure 5A:
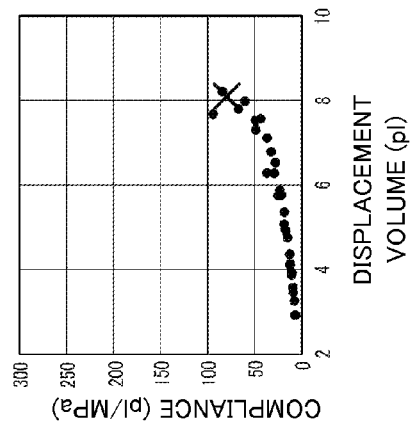
FIGS. 5A to 5F are each a graph indicating the relationship between the compliance and the displacement volume under a second condition.
Figure 5B:
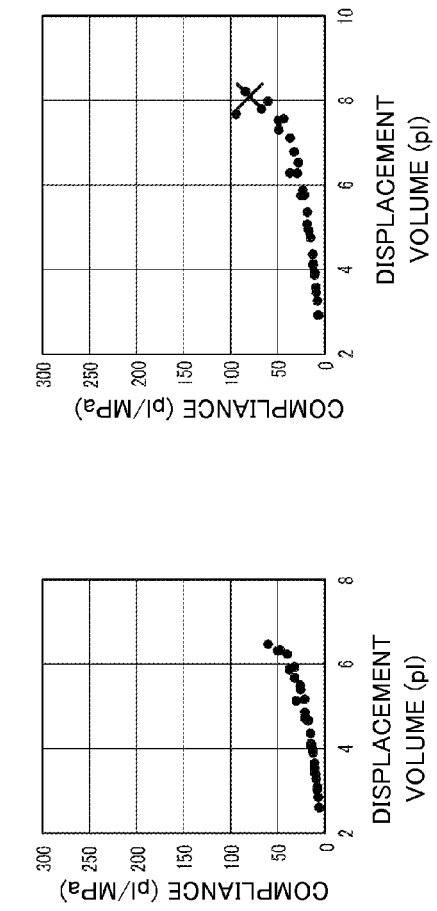

FIG. 5A indicates a graph in a case that the remaining compressive stress of the vibration plate 2 is 0 MPa, wherein the displacement volume and the compliance both tend to increase together, as the thickness T of the piezoelectric actuator 1 becomes smaller. In this case, the piezoelectric actuator 1 does not have any extreme point in the compliance-displacement volume characteristic. FIG. 5B indicates a graph in a case that the remaining compressive stress of the vibration plate 2 is 100 MPa. The case indicated in FIG. 5B also exhibits a similar tendency to that of the case indicated in FIG. 5A.

Figure 5C:
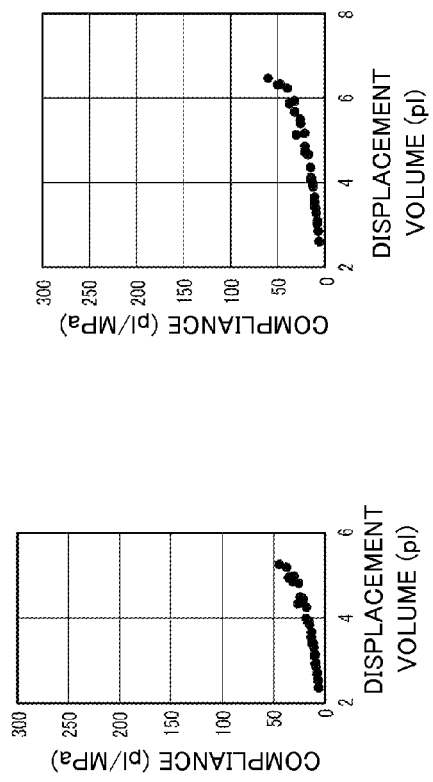

FIG. 5C indicates a graph in a case that the remaining compressive stress of the vibration plate 2 is 200 MPa. In this case, an extreme point (indicated by a sign "X" in FIG. 5C) is derived from an approximate curve based on a plurality of points. The extreme point appears in a case that the thickness T of the piezoelectric actuator 1 is 2.8 µm, and the compliance is 80.0 pl/MPa and the displacement volume is 8.1 pl at the extreme point. In an area in which the compliance is smaller than the extreme point, the displacement volume and the compliance both tend to increase together, as the thickness T of the piezoelectric actuator 1 becomes smaller. In this piezoelectric actuator 1, the difference between the piezoelectric displacement and the initial displacement (corresponding to the displacement volume) takes the maximum value at the extreme point. At the extreme point and in the vicinity of the extreme point, the both effects obtained by the unimorph deformation and restoration in relation to the predetermined applied voltage are in a close competition, and displacement volume hardly increases at the extreme point and in the vicinity thereof. In a case that the compliance is further increased, the displacement volume is gradually decreased. With this, the threshold value for appearance (generation) of the extreme point in relation to the compressive stress of the vibration plate 2, with respect to the pulling stress: 100 MPa of the piezoelectric layer 3, falls within a range of 100 MPa to 200 MPa of the compressive stress.

Figure 5D:
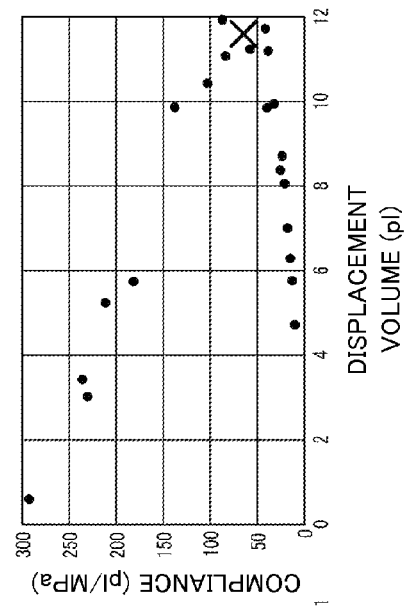
Figure 5E:
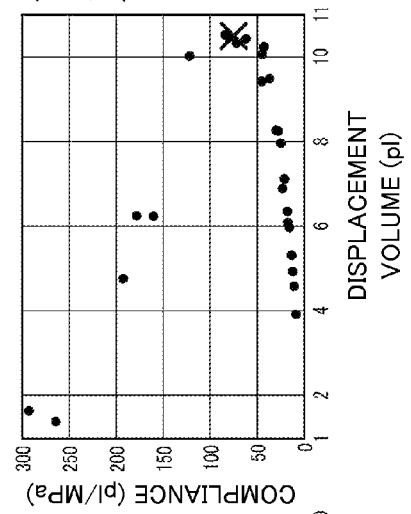
Figure 5F:
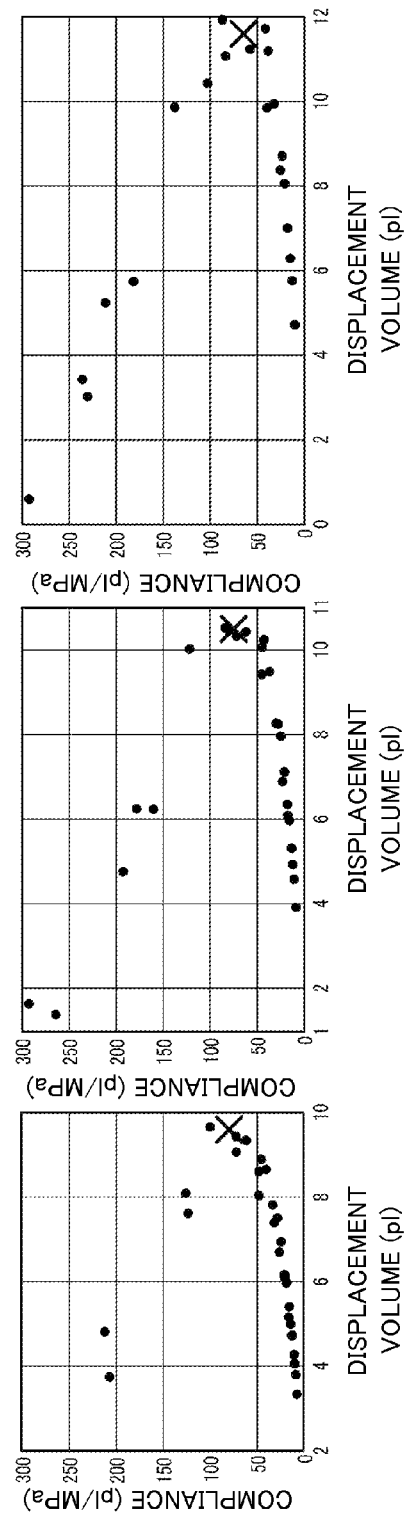

FIG. 5D indicates a graph in a case that the remaining compressive stress of the vibration plate 2 is 300 MPa. In this case, an extreme point derived from the approximate curve appears at a point at which the thickness T of the piezoelectric actuator 1 is 3.5 µm; and the compliance is 80.0 pl/MPa and the displacement volume is 9.6 pl at the extreme point. FIG. 5E indicates a graph in a case that the remaining compressive stress of the vibration plate 2 is 400 MPa. In this case, an extreme point derived from the approximate curve appears at a point at which the thickness T of the piezoelectric actuator 1 is 3.9 µm; and the compliance is 75.0 pl/MPa and the displacement volume is 10.5 pl at the extreme point. FIG. 5F indicates a graph in a case that the remaining compressive stress of the vibration plate 2 is 500 MPa. In this case, an extreme point derived from the approximate curve appears at a point at which the thickness T of the piezoelectric actuator 1 is 4.5 µm; and the compliance is 65.0 pl/MPa and the displacement volume is 11.6 pl at the extreme point. In such a manner, also in the cases indicated in FIGS. 5D to 5F, the relationship between the compliance and the displacement volume with the extreme point intervened therebetween is similar to the case indicated in FIG. 5C.

It is appreciated from FIGS. 4A to 4F and FIGS. 5A to 5F that a larger displacement volume can be obtained as the compressive stress of the vibration plate 2 becomes greater, even in a case that the thickness T of the piezoelectric actuator 1 has a same value. In this case, the piezoelectric layer 3 having the remaining pulling stress is in a state that the piezoelectric layer 3 is hardly deformed (hardly undergoes the buckling-like deformation) in a direction orthogonal to a plane. On the other hand, the vibration plate 2 having the remaining compressive stress is in a state that the vibration plate 2 easily undergoes the buckling-like deformation due to the relationship between the value of the stress and the size and shape. In a case that the above-described piezoelectric layer 3 having the remaining pulling stress and the vibration plate 2 having the remaining compressive stress are combined, then on the part of the vibration plate 2, the vibration plate 2 is stable in a state that the vibration plate is deformed in a projecting manner (in this embodiment, the vibration plate 2 is deformed to project toward the pressure chamber), and the deformation amount (initial deformation amount) is also increased as the remaining compressive stress is increased. The buckling-like state of the piezoelectric actuator 1 depends on the combination of the vibration plate 2 and the piezoelectric layer 3. As the remaining compressive stress is greater, the piezoelectric actuator 1 undergoes the buckling-like state to a greater extent. It is possible to explain, in view of the structural mechanics, that the deformation with respect to the bending moment corresponding to the driving force at the time of voltage application is easier as the initial deformation is greater. Namely, the pulling stress of the piezoelectric layer 3 is mitigated by the compressive stress of the vibration plate 2, and thus the deformability of the piezoelectric actuator 1 is improved. Further, also from a viewpoint that a larger displacement volume can be obtained with a same compliance, it is more preferred as the compressive stress of the vibration plate 2 is made higher to a greater extent.

In a case that the compressive stress of the vibration plate 2 becomes higher, the extreme point appears in the compliance-displacement volume characteristic. This extreme point appears not only under the first and second conditions, but appears in a similar manner also in experiments conducted by variously changing the shape of the pressure chamber 10, the material and layer configuration of the piezoelectric actuator 1 and the magnitude of the pulling stress, under the condition that the vibration plate 2 has a certain compressive stress. For example, in a case that regarding the second condition, the remaining pulling stress of the piezoelectric layer 3 was changed to 400 MPa, the extreme point shifted to a side of a greater displacement volume as the compressive stress of the vibration plate 2 was increased, although not as much as an extent regarding the case of the remaining pulling stress of 100 MPa. Specifically, in a case that the threshold value for appearance (generation) of the extreme point falls within a range of 100 MPa to 200 MPa and the extreme point appears at a point that the compressive stress is 200 MPa, the extreme point appears under the following conditions that are: the thickness of the piezoelectric actuator 1 is 3.1 µm, the compliance is 50.0 pl/MPa and the displacement volume is 6.0 pl. In a case that the extreme point appears at a point that the compressive stress is 300 Mpa, the extreme point appears under the following conditions that are: the thickness of the piezoelectric actuator 1 is 3.6 µm, the compliance is 50.0 pl/MPa and the displacement volume is 7.0 pl. In a case that the extreme point appears at a point that the compressive stress is 400 Mpa, the extreme point appears under the following conditions that are: the thickness of the piezoelectric actuator 1 is 4.1 µm, the compliance is 40.0 pl/MPa and the displacement volume is 7.6 pl. In a case that the extreme point appears at a point that the compressive stress is 500 Mpa, the extreme point appears under the following conditions that are: the thickness of the piezoelectric actuator 1 is 4.6 µm, the compliance is 40.0 pl/MPa and the displacement volume is 8.0 pl. In a case that the remaining pulling stress of the piezoelectric layer 3 is made to be 200 MPa, the respective index values indicate intermediates values between the case that the remaining pulling stress is 100 MPa and the case that the remaining pulling stress is 400 MPa.

In a piezoelectric actuator 1 having a thickness T not more than the thickness T at which the extreme point appears, compressive stress which is disproportionally excessive relative to the rigidity of the piezoelectric actuator 1 is inherent. In this situation, the piezoelectric actuator 1 has a large initial deformation which can even be referred to as the buckling-like deformation. The piezoelectric actuator 1 in such a state is fragile relative to an external force. Accordingly, if the piezoelectric actuator 1 is driven in such a state, any cracks easily occur in the displacement area of the piezoelectric actuator 1. The piezoelectric actuator 1 of the present embodiment, however, has the thickness that is not less than the thickness with which the extreme point appears. Therefore, the remaining compressive stress does not become disproportionally excessive relative to the rigidity of the piezoelectric actuator 1 itself, thereby making it possible to avoid the buckling-like deformation. Thus, the piezoelectric actuator 1 is capable of freely generating deformation corresponding to the driving condition, without causing any damage or breakage such as cracks.

As described above, in the piezoelectric actuator 1 according to the embodiment, the piezoelectric layer 3 has the pulling stress, but the pulling stress of the piezoelectric layer 3 is mitigated by the compressive stress of the vibration plate 2, and further the compliance of the piezoelectric actuator 1 itself is at least not more than a compliance allowing an extreme point to appear on the compliance-displacement volume characteristic corresponding to the threshold value regarding the compressive stress of the vibration plate 2 (namely, the thickness of the piezoelectric actuator 1 itself is not less than the thickness corresponding to the threshold value). Therefore, the deformability of the piezoelectric actuator 1 is improved corresponding to the compressive stress of the vibration plate 2. Further, in the piezoelectric actuator 1, the remaining compressive stress does not become disproportionally excessive relative to the rigidity of the piezoelectric actuator 1 itself, and thus is capable of avoiding the buckling-like deformation. Therefore, it is possible to suppress any breakage of the piezoelectric actuator 1 while securing a high deformability of the piezoelectric actuator 1. In addition, since the vibration plate 2 has the compressive stress not less than the threshold value, the displacement volume becomes greater, namely, the piezoelectric actuator 1 consequently has a high deformability.

Furthermore, in a case that the extreme point appears under a condition different from the first and second conditions in a piezoelectric actuator in which the piezoelectric layer 3 has the pulling stress and the vibration plate 2 has the compressive stress, it is allowable that the piezoelectric actuator 1 has a compliance smaller that the compliance at which the extreme point appears. With this, the effect similar to that described above can be obtained. Moreover, the thickness T of the piezoelectric actuator 1 is preferably not less than 120% of the predetermined thickness at which the extreme point appears. With this, the piezoelectric actuator 1 assuredly has a high deformability. The thickness T of the piezoelectric actuator 1 is more preferably not less than 110% of the predetermined thickness at which the extreme point appears. With this, the piezoelectric actuator 1 has a higher deformability. The thickness T of the piezoelectric actuator 1 is most preferably not less than 105% of the predetermined thickness at which the extreme point appears. With this, the piezoelectric actuator 1 has an extremely high deformability.

Furthermore, the inventor of the present teaching considered other configurations for mitigating the pulling stress of the piezoelectric layer (piezoelectric member) by allowing compressive stresses having a variety of kinds of magnitudes to remain in the vibration plate. The compressive stress allowed to remain in the vibration plate 2 was varied, for example, in a range of 400 Mpa to 500 Mpa and a thickness T of the piezoelectric actuator 1 was varied at a regular amount for each of the varied compressive stresses; and an investigation was carried out regarding the relationship between a displacement volume (pl) and the compliance in relation to the combination of these conditions which were the varied compressive stress and the varied thicknesses T. In this case, the thickness of the vibration plate-body 2a was varied in a range of 1.2 µm to 2.0 µm, and the thickness of the piezoelectric layer 3 was varied in a range of 0.4 µm to 1.0 µm. The thickness T of the piezoelectric actuator 1 was varied in a range of 1.6 µm to 3.0 µm at a 0.2 µm-segment. Note that the constitutive parts of the piezoelectric actuator 1, which are different from the vibration plate-body 2a and the piezoelectric layers 3, were formed by a common film-forming condition so as to have the entire and constant thickness of 0.33 μm. Specifically, the thickness of the individual electrode 4 is 0.05 μm, the thickness of the common electrode 2c is 0.12 μm, and the thickness of the protective layer 2b is 0.08 μm. A vibration plate-body 2a is formed by stacking a plasma CVD film on a thermal oxidation film (thickness: 0.08 μm) formed on the upper surface of a supporting substrate 11 made of silicon (Si). A width W1 of the pressure chamber 10 (the width in the up and down direction in FIG. 1B) was made to be 70 μm, a width W2 of the piezoelectric layer 3 (the width in the up and down direction in FIG. 1B) was made to be 50 μm; and the pulling stress of the piezoelectric layer 3 was made to be 200 Mpa, and the voltage applied to the individual electrode 4 and the common electrode 2c was made to have a predetermined, fixed value.

A plurality of points indicated in each of FIGS. 6A to 6F correspond to thickness T, of the piezoelectric actuator 1, which is varied at a 0.2 μm-segment in a variation range of 1.6 μm to 3.0 μm. In this case, the thickness of the piezoelectric layer 3 is in a thickness range of 0.4 μm to 1.0 μm, the thickness of the vibration plate-body 2a is in a thickness range of 1.2 μm to 2.0 μm, and the piezoelectric layers 3 having the respective thicknesses in the thickness range and the vibration plate-bodies 2a having the respective thicknesses in the thickness range are combined.

Figure 6A:
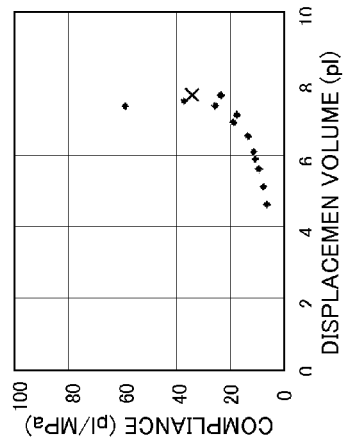
FIGS. 6A to 6F are each a graph indicating the relationship between the compliance and the displacement volume under another condition.
Figure 6B:
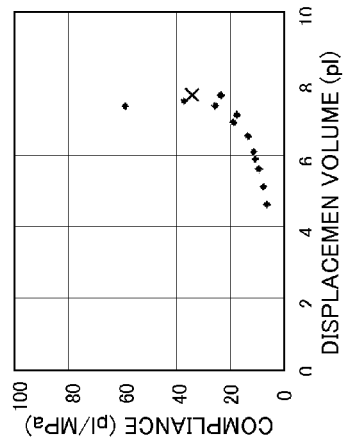

FIG. 6A indicates a graph in a case that the remaining compressive stress of the vibration plate 2 is 400 MPa, wherein the displacement volume and the compliance both tend to increase together, as the thickness T of the piezoelectric actuator 1 becomes smaller. In this case, the piezoelectric actuator 1 does not have any extreme point in the compliance-displacement volume characteristic. FIG. 6B indicates a graph in a case that the remaining compressive stress of the vibration plate 2 is 420 MPa. The case indicated in FIG. 6B also exhibits a similar tendency to that of the case indicated in FIG. 6A.

Figure 6C:
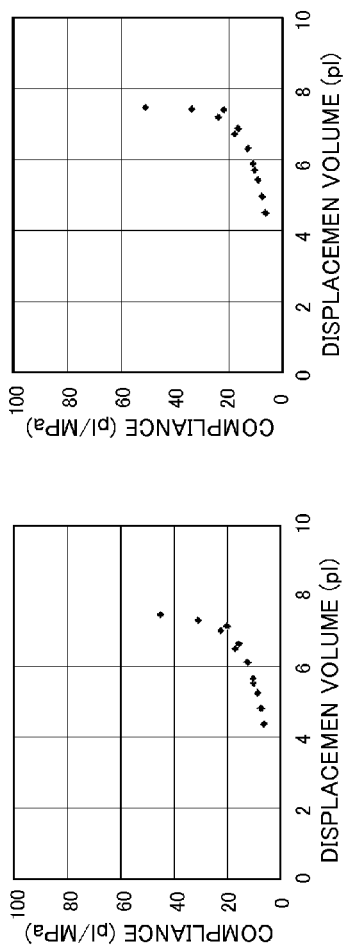

FIG. 6C indicates a graph in a case that the remaining compressive stress of the vibration plate 2 is 440 MPa. In this case, an extreme point (indicated by a sign "X" in FIG. 6C) is derived from an approximate curve based on a plurality of points. The extreme point appears in a case that the thickness T of the piezoelectric actuator 1 is thinner than 2.0 μm, and the compliance is 34 pl/MPa and the displacement volume is 7.7 pl at the extreme point. In an area in which the compliance is smaller than the extreme point, the displacement volume and the compliance both tend to increase together, as the thickness T of the piezoelectric actuator 1 becomes smaller, in a similar manner as in the cases indicated in FIGS. 6A and 6B. In this piezoelectric actuator 1, the difference between the piezoelectric displacement and the initial displacement (corresponding to the displacement volume) takes the maximum value at the extreme point. At the extreme point and in the vicinity of the extreme point, the both effects obtained by the unimorph deformation and restoration in relation to the predetermined applied voltage are in a close competition, and displacement volume hardly increases at the extreme point and in the vicinity thereof. As the thickness T of the piezoelectric actuator 1 becomes smaller, the compliance is further increased, and the displacement volume is gradually decreased. With this, the threshold value for appearance (generation) of the extreme point in relation to the compressive stress of the vibration plate 2, with respect to the pulling stress: 200 MPa of the piezoelectric layer 3, falls within a range of 420 MPa to 440 MPa of the compressive stress.

Figure 6D:
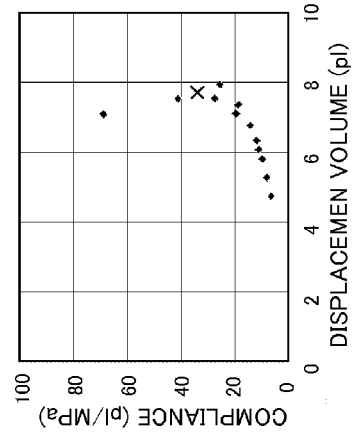

FIG. 6D indicates a graph in a case that the remaining compressive stress of the vibration plate 2 is 460 MPa. In this case, an extreme point derived from the approximate curve appears at a point at which the thickness T of the piezoelectric actuator 1 is thinner than 2.0 μm; and the compliance is 34 pl/MPa and the displacement volume is 7.7 pl at the extreme point. The relationship between the compliance and the displacement volume with the extreme point intervened therebetween is similar to the case that the remaining compressive stress is 440 MPa.

Figure 6E:
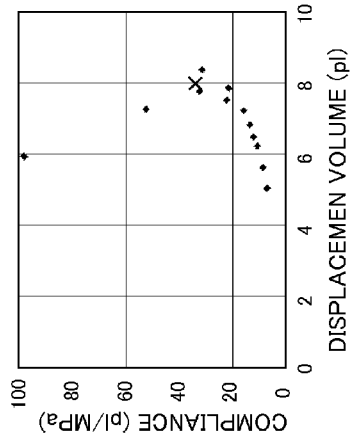

FIG. 6E indicates a graph in a case that the remaining compressive stress of the vibration plate 2 is 480 MPa. In this case, an extreme point derived from the approximate curve appears at a point at which the thickness T of the piezoelectric actuator 1 is thinner than 2.0 μm; and the compliance is 34 pl/MPa and the displacement volume is 7.8 pl at the extreme point. The relationship between the compliance and the displacement volume with the extreme point intervened therebetween is similar to the cases that the remaining compressive stresses are 440 MPa.

Figure 6F:
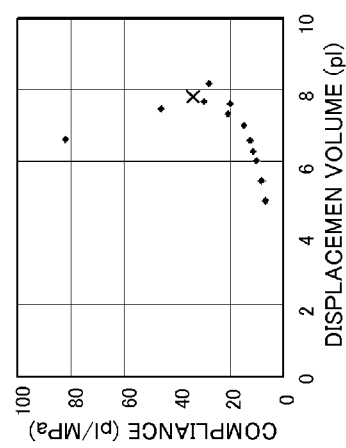

FIG. 6F indicates a graph in a case that the remaining compressive stress of the vibration plate 2 is 500 MPa. In this case, an extreme point derived from the approximate curve appears at a point at which the thickness T of the piezoelectric actuator 1 is thinner than 2.0 μm; and the compliance is 34 pl/MPa and the displacement volume is 8.0 pl at the extreme point. The relationship between the compliance and the displacement volume with the extreme point intervened therebetween is similar to the cases that the remaining compressive stresses are 440 MPa.

Even in a case that, as a modification, the vibration plate 2 is formed during the production such that the predetermined compressive stress does not remain in the vibration plate 2, there still arise a state that, as the thickness of the vibration plate 2 is made to be smaller, the vibration plate 2 has the compressive stress by being affected by the remaining pulling stress of the piezoelectric layer 3, namely by the external force causing the piezoelectric layer 3 to shrink. In a case that the thickness of the vibration plate 2 is made to be further smaller, the extreme point appears in the compliance-displacement volume characteristic, due to the above-described compressive stress (stress generated by being affected by the pulling stress). Namely, the above-described extreme point appears, and the compressive stress has a magnitude that is not less than the threshold value. Also in this case, the effect similar to that described above can be achieved by allowing the thickness T of the piezoelectric actuator 1 to be a thickness that is not less than the thickness (predetermined thickness) at which the extreme point appears.

In the above, the preferred embodiment of the present teaching has been explained. The present teaching, however, is not limited to the above-described embodiment, and may be changed in various way within the range described in the following claims. The piezoelectric actuator of the present teaching is applicable to any apparatus provided that such an apparatus is configured to discharge a liquid. Further, the piezoelectric actuator of the present teaching is not limited to the application for discharging a liquid, and is applicable also to a piezoelectric actuator adopted for imparting pressure to a liquid for any usage other than the liquid discharge. Further, the common electrode 2c may be provided only at an area facing the individual electrodes 4. Furthermore, it is allowable that the individual electrodes 4 are arranged at a position at which the common electrode 2c is arranged and that the common electrode 2c is arranged at a positon at which the individual electrodes 4 are arranged. Namely, the individual electrodes 4 and the common electrode 2 may be arranged in any way provided that the individual electrodes 4 and the common electrode 2 are arranged to sandwich the piezoelectric layers 3 therebetween. Moreover, the protective layer 2b may be omitted. Further, each of the protective layer 2b, the common electrode 2c, the piezoelectric layers 3, and the individual electrodes 4 may be formed of a material different from that described above.

What is claimed is:

1. A piezoelectric actuator which is fixed to one flat surface to cover a pressure chamber opening in the one flat surface and which is configured to displace to project toward the pressure chamber based on an electric voltage applied to the piezoelectric actuator so as to apply pressure to a liquid inside the pressure chamber, the piezoelectric actuator comprising:
    a vibration plate fixed to the one flat surface and having a compressive stress;
    a piezoelectric layer having a pulling stress and stacked on the vibration plate at a position which is on an opposite side to the one flat surface and at which the piezoelectric layer overlaps with the pressure chamber in a direction orthogonal to the one flat surface; and
    an individual electrode stacked on the piezoelectric layer, wherein the compressive stress of the vibration plate has a magnitude not less than a threshold value at which an extreme point is generated in a relationship between a compliance of the piezoelectric actuator and a displacement volume of the pressure chamber in a case that the voltage is applied to the piezoelectric actuator, the displacement volume converting from increasing to decreasing relative to increase in the compliance at the extreme point; and
    a thickness of the piezoelectric actuator is not less than a first thickness corresponding to a compliance allowing the extreme point to generate.

2. The piezoelectric actuator according to claim 1, wherein the piezoelectric layer is formed on the vibration plate with a sol-gel method.

3. The piezoelectric actuator according to claim 1, wherein the thickness of the piezoelectric actuator is not less than 105% of the first thickness.

4. The piezoelectric actuator according to claim 3, wherein the thickness of the piezoelectric actuator is not less than 120% of the first thickness.

5. A recording head configured to discharge a liquid onto a medium to perform recording, the recording head comprising:
    a supporting substrate having a plurality of pressure chambers formed in one surface of the supporting substrate and opening in the one surface; and
    the piezoelectric actuator as defined in claim 1,
    wherein the vibration plate is fixed to the one surface of the supporting substrate to straddle the pressure chambers.

6. The recording head according to claim 5, wherein the vibration plate includes a facing electrode, and the facing electrode and the individual electrode are arranged so as to sandwich the piezoelectric layer therebetween in a stacking direction in which the piezoelectric layer is stacked on the vibration plate; and
    the piezoelectric actuator is deformed to project toward the pressure chamber in a state that the electric voltage is not applied between the individual electrode and the facing electrode.

7. The recording head according to claim 5, wherein each of the pressure chambers and each of the piezoelectric layers have a length in a longitudinal direction greater than a length in a width direction orthogonal to the longitudinal direction; and
    the length in the width direction of each of the pressure chambers is in a range of 100 μm to 132 μm;
    the compressive strength of the vibration plate is in a range of 300 Mpa to 500 Mpa;
    each of the piezoelectric layers is stacked on the vibration plate at an area at which each of the piezoelectric layers faces one of the pressure chambers;
    the length in the width direction of each of the piezoelectric layers is in a range of 70 μm to 92 μm;
    the pulling strength of each of the piezoelectric layers is in a range of 100 Mpa to 400 Mpa; and
    the thickness of the piezoelectric actuator is not less than 4.5 μm.

8. The recording head according to claim 5, wherein each of the pressure chambers and each of the piezoelectric layers have a length in a longitudinal direction greater than a length in a width direction orthogonal to the longitudinal direction; and
    the length in the width direction of each of the pressure chambers is in a range of 100 μm to 132 μm;
    the compressive strength of the vibration plate is in a range of 300 Mpa to 400 Mpa;
    each of the piezoelectric layers is stacked on the vibration plate at an area at which each of the piezoelectric layers faces one of the pressure chambers;
    the length in the width direction of each of the piezoelectric layers is in a range of 70 μm to 92 μm;
    the pulling strength of each of the piezoelectric layers is in a range of 100 Mpa to 400 Mpa; and
    the thickness of the piezoelectric actuator is not less than 3.9 μm.

9. The recording head according to claim 5, wherein each of the pressure chambers and each of the piezoelectric layers have a length in a longitudinal direction greater than a length in a width direction orthogonal to the longitudinal direction; and
    the length in the width direction of each of the pressure chambers is in a range of 70 μm to 100 μm;
    the compressive strength of the vibration plate is in a range of 440 Mpa to 500 Mpa;
    each of the piezoelectric layers is stacked on the vibration plate at an area at which each of the piezoelectric layers faces one of the pressure chambers;
    the length in the width direction of each of the piezoelectric layers is in a range of 50 μm to 70 μm;
    the pulling strength of each of the piezoelectric layers is in a range of 100 Mpa to 400 Mpa; and
    the thickness of the piezoelectric actuator is not less than 3.3 μm.

10. The piezoelectric actuator according to claim 5, wherein the supporting substrate is a silicon substrate; and
    the vibration plate includes a two-layered structure constructed of a thermal oxidation film formed on the one flat surface and a silicon oxide film stacked on the thermal oxidation film.

11. The piezoelectric actuator according to claim 10, wherein the vibration plate includes:
    a vibration-plate body including the thermal oxidation film and the silicon oxide film;
    a silicon nitride film stacked on the silicon oxide film; and
    an aluminum oxide film as a protective layer stacked on the silicon nitride film.

12. A recording head configured to discharge a liquid onto a medium to perform recording, the recording head comprising:
    a supporting substrate having a plurality of pressure chambers formed in one surface of the supporting substrate and opening in the one surface; and a piezoelectric actuator including:
- a vibration plate fixed to the one surface so as to straddle the pressure chambers and having a compressive stress,
- a plurality of piezoelectric layers which have a pulling stress and each of which is stacked on a surface, of the vibration plate, on a side opposite to the one surface so as to face one of the pressure chambers, and
- a plurality of first electrode layers each of which is stacked on an upper surface, of one of the piezoelectric layers, on a side opposite to the one surface, wherein each of the pressure chambers and each of the piezoelectric layers have a length in a longitudinal direction greater than a length in a width direction orthogonal to the longitudinal direction; and the length in the width direction of each of the pressure chambers is in a range of 100 μm to 132 μm;

the compressive strength of the vibration plate is in a range of 300 Mpa to 500 Mpa;

each of the piezoelectric layers is stacked on the vibration plate at an area at which each of the piezoelectric layers faces one of the pressure chambers;

the length in the width direction of each of the piezoelectric layers is in a range of 70 μm to 92 μm;

the pulling strength of each of the piezoelectric layers is in a range of 100 Mpa to 400 Mpa; and the thickness of the piezoelectric actuator is not less than 4.5 μm.

13. A recording head configured to discharge a liquid onto a medium to perform recording, the recording head comprising:
- a supporting substrate having a plurality of pressure chambers formed in one surface of the supporting substrate and opening in the one surface; and
- a piezoelectric actuator including:
  - a vibration plate fixed to the one surface so as to straddle the pressure chambers and having a compressive stress,
  - a plurality of piezoelectric layers which have a pulling stress and each of which is stacked on a surface, of the vibration plate, on a side opposite to the one surface so as to face one of the pressure chambers, and
  - a plurality of first electrode layers each of which is stacked on an upper surface, of one of the piezoelectric layers, on a side opposite to the one surface, wherein each of the pressure chambers and each of the piezoelectric layers have a length in a longitudinal direction greater than a length in a width direction orthogonal to the longitudinal direction; and the length in the width direction of each of the pressure chambers is in a range of 100 μm to 132 μm;

the compressive strength of the vibration plate is in a range of 300 Mpa to 400 Mpa;

each of the piezoelectric layers is stacked on the vibration plate at an area at which each of the piezoelectric layers faces one of the pressure chambers;

the length in the width direction of each of the piezoelectric layers is in a range of 70 μm to 92 μm;

the pulling strength of each of the piezoelectric layers is in a range of 100 Mpa to 400 Mpa; and the thickness of the piezoelectric actuator is not less than 3.9 μm.

14. A recording head configured to discharge a liquid onto a medium to perform recording, the recording head comprising:
- a supporting substrate having a plurality of pressure chambers formed in one surface of the supporting substrate and opening in the one surface; and
- a piezoelectric actuator including:
  - a vibration plate fixed to the one surface so as to straddle the pressure chambers and having a compressive stress,
  - a plurality of piezoelectric layers which have a pulling stress and each of which is stacked on a surface, of the vibration plate, on a side opposite to the one surface so as to face one of the pressure chambers, and
  - a plurality of first electrode layers each of which is stacked on an upper surface, of one of the piezoelectric layers, on a side opposite to the one surface, wherein each of the pressure chambers and each of the piezoelectric layers have a length in a longitudinal direction greater than a length in a width direction orthogonal to the longitudinal direction; and the length in the width direction of each of the pressure chambers is in a range of 70 μm to 100 μm;

the compressive strength of the vibration plate is in a range of 440 Mpa to 500 Mpa;

each of the piezoelectric layers is stacked on the vibration plate at an area at which each of the piezoelectric layers faces one of the pressure chambers;

the length in the width direction of each of the piezoelectric layers is in a range of 50 μm to 72 μm;

the pulling strength of each of the piezoelectric layers is in a range of 100 Mpa to 400 Mpa; and the thickness of the piezoelectric actuator is not less than 3.3 μm.

* * * * *